United States Patent
Hsueh et al.

(10) Patent No.: US 7,286,071 B1
(45) Date of Patent: Oct. 23, 2007

(54) SYSTEM FOR DISPLAYING IMAGES

(75) Inventors: Fu-Yuan Hsueh, Taoyuan County (TW); Keiichi Sano, Taipei (TW); Cheng-Ho Yu, Changhua County (TW); Wei-Cheng Lin, Kaohsiung (TW)

(73) Assignee: IPO Displays Corp, Miao-Li County (TW)

( * ) Notice: Subject to any disclaimer, the term of this patent is extended or adjusted under 35 U.S.C. 154(b) by 0 days.

(21) Appl. No.: 11/464,237

(22) Filed: Aug. 14, 2006

(51) Int. Cl.
*H03M 1/66* (2006.01)

(52) U.S. Cl. .................................. 341/145; 341/144
(58) Field of Classification Search ......... 341/135–172
See application file for complete search history.

(56) References Cited

U.S. PATENT DOCUMENTS 6,556,162 B2 * 4/2003 Brownlow et al. ......... 341/145

\* cited by examiner

*Primary Examiner*—Lam T. Mai
(74) *Attorney, Agent, or Firm*—Thomas, Kayden, Horstemeyer & Risley (57) ABSTRACT

Systems for displaying images. The system comprises a digital-to-analog converter, in which a first conversion stage selects first and second voltages of a plurality of reference voltages according to m most significant bits of a k bit input signal; and a second conversion stage converting n least significant bits of the k bit input signal to a voltage between the first and second voltages. In the second conversion stage, according to first and second bits of the least significant bits, a first switching capacitor unit charges a first capacitor during a first period and then the second switching capacitor unit performs a first charge sharing between the first capacitor and a second capacitor, and the first switching capacitor unit charges the first capacitor again and then the second switching capacitor unit performs a second charge sharing between the first capacitor and the second capacitor.

19 Claims, 8 Drawing Sheets

SYSTEM FOR DISPLAYING IMAGES

BACKGROUND OF THE INVENTION

1. Field of the Invention

The invention relates to display panels.

2. Description of the Related Art

Liquid crystal displays (LCDs) are used in a variety of applications, including calculators, watches, color televisions, computer monitors, and many other electronic devices. Active-matrix LCDs are a well known type of LCDs. In a conventional active matrix LCD, each picture element (or pixel) is addressed using a matrix of thin film transistors (TFTs) and one or more capacitors. The pixels are arranged and wired in an array having a plurality of rows and columns.

To address a particular pixel, the switching TFTs of a specific row are switched "on" (i.e., charged with a voltage), and then data voltage is sent to the corresponding column. Since other intersecting rows are turned off, only the capacitor at the specific pixel receives the data voltage charge. In response to the applied voltage, the liquid crystal cell of the pixel changes its polarization, and thus, the amount of light reflected from or passing through the pixel changes. In liquid crystal cells of a pixel, the magnitude of the applied voltage determines the amount of light reflected from or passing through the pixel.

Further, "System-on-glass" LCDs that allow integration of various LCD driving circuits and functions require no external integrated circuits (ICs), providing low cost, compact and highly reliable displays. The integrated driving circuits of such an LCD comprise a scan driver selecting a row of pixels and a data driver writing display data into each pixel in the selected row. Generally, data drivers require digital-to-analog converters (DACs) to generate analog voltages serving as display data and driving corresponding pixels. However, DACs in data driver require a larger layout area for high resolution applicant.

BRIEF SUMMARY OF INVENTION

Embodiments of a system for displaying images are provided, in which a digital-to-analog converter comprises first and second conversion stages. The first conversion stage selects first and second voltages of a plurality of reference voltages according to m most significant bits of a k bit input signal. The second conversion stage precharges an output load to the first voltage selected by the first conversion stage and converting n least significant bits of the k bit input signal to a voltage between the first and second voltages. The second conversion stage comprises first and second switching capacitor units connected in series, in which the first switching capacitor unit, according to a first bit of the n least significant bits, selectively charges a first capacitor to the first voltage or the second voltage and then the second switching capacitor unit performs a first charge sharing between the first capacitor and a second capacitor. The first switching capacitor unit, according to a second bit of the n least significant bits, selectively charges the first capacitor to the first voltage or the second voltage again and then the second switching capacitor unit performs a second charge sharing between the first capacitor and the second capacitor.

The invention also provides another embodiment of a system for displaying images, in which a digital-to-analog converter comprises first and second conversion stages. The first conversion stage selects first and second voltages of a plurality of reference voltages according to m most significant bits of a k bit input signal, in which the first voltage is smaller that the second voltage. The second conversion stage converts n least significant bits of the k bit input signal to a voltage between the first and second voltages, and the second conversion stage comprises first and second capacitors coupled between a first node and a first power voltage and a second node and the first power voltage respectively, first switch coupled between the first voltage and the first node, second switch coupled between the second voltage and the first node, third switch coupled between the first node and the second node, and fourth switch coupled between the first voltage and the second node. During a first period, the first and the fourth switches are turned on to precharge the first and second capacitors to the first voltage. During a second period, the first and second switches are selectively turned on according to a first bit of the n least significant bits, charging the first capacitor and then the third switch is turned on such that a first charge sharing is performed between the first and the second capacitor. During a third period, and the first and second switches are selectively turned on according to a second bit of the n least significant bits, charging the first capacitor again and then the third switch is turned on such that a second charge sharing is performed between the first and the second capacitor.

The invention also provides another embodiment of a system for displaying images, in which a digital-to-analog converter comprises first and second conversion stages. The first conversion stage selects first and second voltages of a plurality of reference voltages according to m most significant bits of a k bit input signal. The second conversion stage converting n least significant bits of the k bit input signal to a voltage between the first and second voltages, wherein the second conversion stage comprises first and second switching capacitor units and a controller. The first switching capacitor unit comprises first and second switches and a first capacitor, and the second switching capacitor unit connected to the first switching capacitor unit in series and comprises third switches and a second capacitor, and the first and second switching capacitor units precharge an output load to the first voltage during a first period. The controller selectively outputs the first and second voltages to the first switching capacitor unit according to the n least significant bits. During a second period, the controller selectively outputs the first voltage or the second voltage according to a first bit of the n least significant bits such that the first switching capacitor unit charges a first capacitor accordingly and the second switching capacitor unit performs a first charge sharing between the first capacitor and the second capacitor. During a second period, the controller selectively outputs the first voltage or the second voltage again according to a second bit of the n least significant bits such that the first switching capacitor unit charges a first capacitor accordingly and the second switching capacitor unit performs a second charge sharing between the first capacitor and the second capacitor.

BRIEF DESCRIPTION OF DRAWINGS

The invention can be more fully understood by reading the subsequent detailed description and examples with references made to the accompanying drawings, wherein.

DETAILED DESCRIPTION OF INVENTION

This description is made for the purpose of illustrating the general principles of the invention and should not be taken in a limiting sense. The scope of the invention is best determined by reference to the appended claims.

Figure 1:
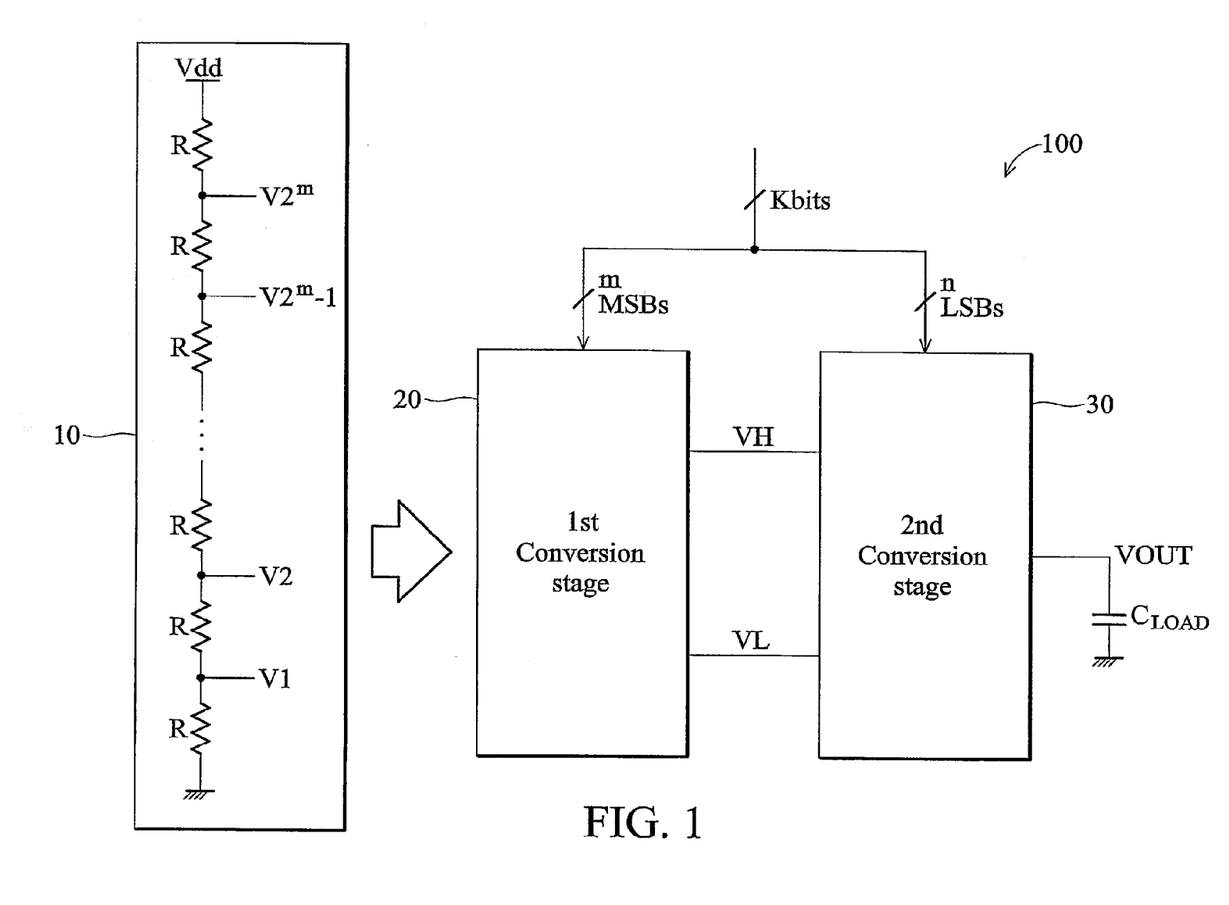
FIG. 1 shows an embodiment of a digital-to-analog converter.

FIG. 1 shows an embodiment of a digital-to-analog converter for a data driver in a system for display images. As shown, the digital-to-analog converter (DAC) 100 comprises a reference voltage generation unit 10 and two cascaded conversion stages 20 and 30. The reference voltage generation unit 10 generates a plurality of reference voltages V1, V2, . . . , $V2^m$. For example, the reference voltage generation unit 10 comprises a resistor string composed of a plurality of resistors R.

Figure 2:
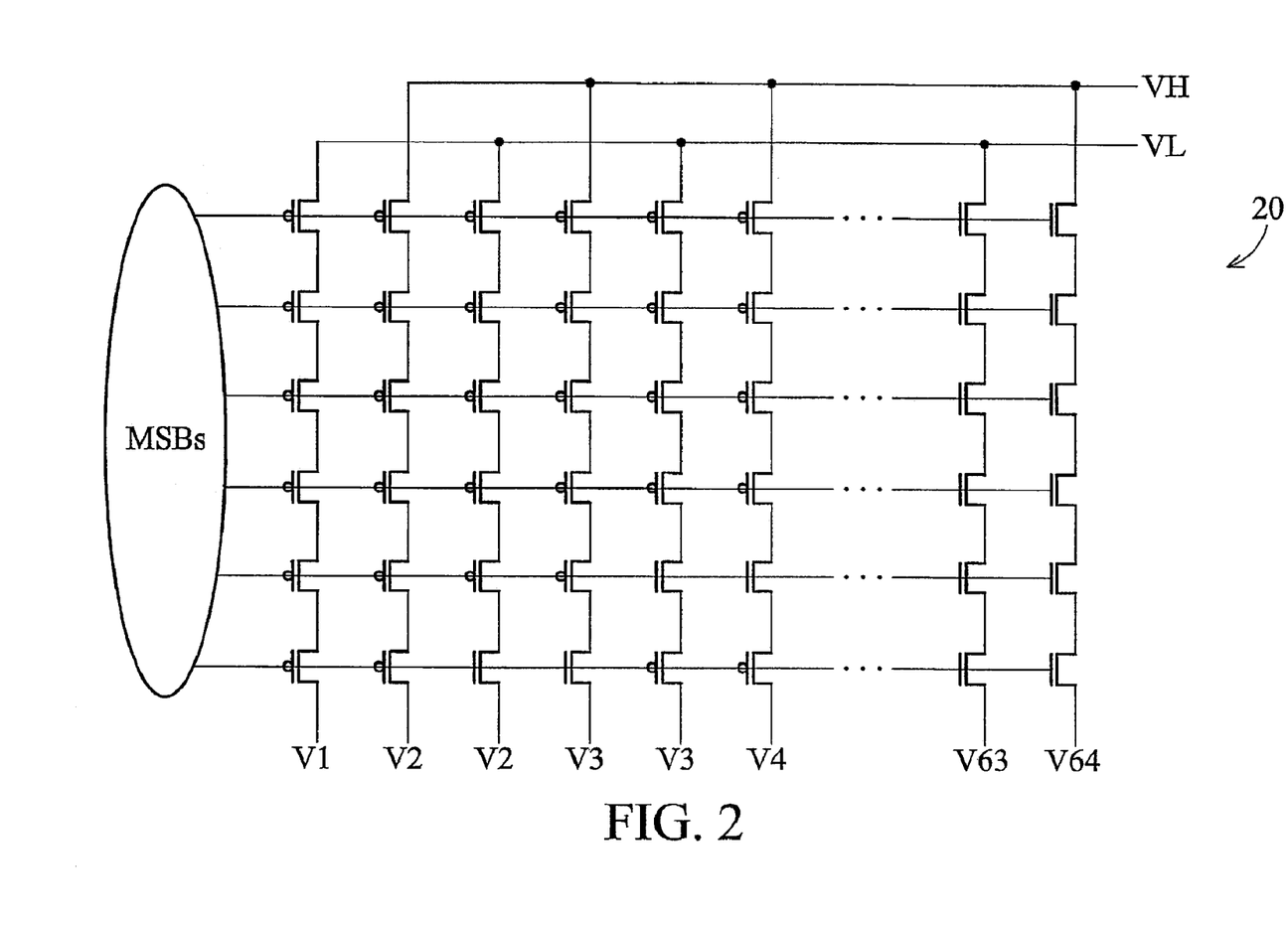
FIG. 2 shows an embodiment of a first conversion stage.

The first conversion stage 20 receives m most significant bits (MSBs) of a k bit parallel input signal and selects a pair of voltages from the reference voltages V1, V2, . . . , $V2^m$ provided by the reference voltage generation unit 10, serving as voltages VH and VL and supplying to the second conversion stage 20. For example, the first conversion stage 20 can be a R-matrix digital-to-analog converter shown in FIG. 2, the R-matrix DAC comprises a plurality of transistors arranged in a matrix, and turns on two adjacent columns of transistors according to the m most significant bits (MSBs), such that two of the reference voltages V1, V2, . . . , $V2^m$ provided by the reference voltage generation unit 10 are selected to serves as reference voltages VH and VL. For example, the two reference voltages selected by the first conversion stage 20 have consecutive values.

As shown in FIG. 1, the second conversion stage 30 receives n least significant bits (LSBs) of the k bit input signal, and performs a n-bit linear conversion in the voltage range defined by the reference voltages VH and VL to obtain an output voltage VOUT. For example, m+n=k, and the output of the second conversion stage 30 is coupled to a load such as a capacitive load $C_{LOAD}$. The second conversion stage 30 precharges the load $C_{LOAD}$ to the voltage VL provided by the first conversion stage in a precharge period, and performs charge sharing to obtain the output voltage VOUT after the precharge period according to the reference voltages VH and VL and the n least significant bits (LSBs).

Figure 3:
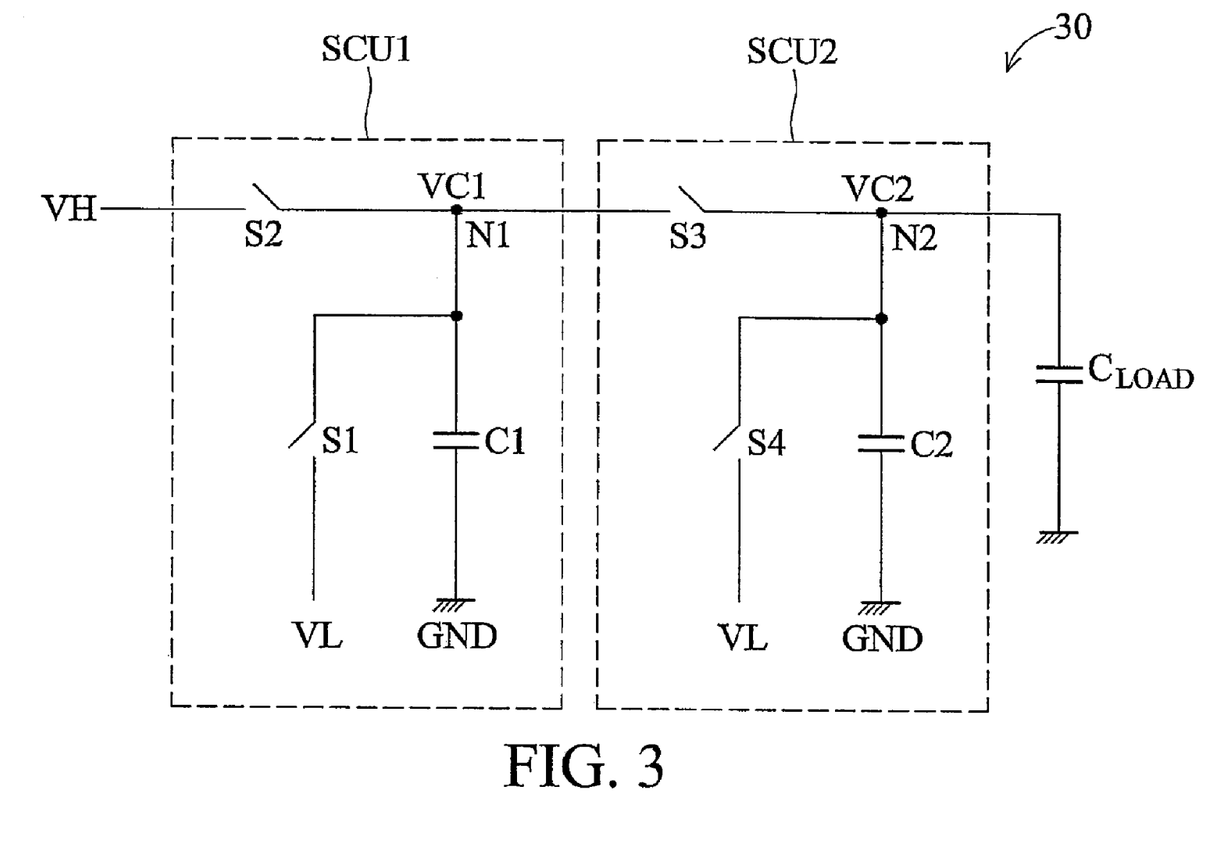
FIG. 3 shows an embodiment of a second conversion stage.

FIG. 3 shows an embodiment of a second conversion stage. As shown, the second conversion stage 30 is a switching capacitor digital-to-analog converter performing a linear DAC conversion. The second conversion stage 30 comprises two switching capacitor units SCU1 and SCU2 connected in series, but the invention is not limited thereto, and it also can comprises three or more switching capacitor units. In this embodiment, each switching capacitor unit SCU1 and SCU2 comprises two switches and a capacitor. For example, in the switching capacitor unit SCU1, the switch S1 is coupled between the reference voltage VL and a node N1, the switch S2 is coupled between the reference voltage VH and the node N1, and the capacitor C1 is coupled between the node N1 and the power voltage GND. In the switching capacitor unit SCU2, the switch S4 is coupled between the reference voltage VL and a node N2, the switch S3 is coupled between the nodes N1 and N2, and the capacitor C2 is coupled between the node N2 and the power voltage GND. In this embodiment, the switches S1~S4 are controlled by a timing controller 110 shown in FIG. 7.

In case of n=2, according to a first bit of the least significant bits, the switching capacitor unit SCU1 selectively charges a capacitor C1 to the voltage VL or the voltage VH and then the switching capacitor unit SCU2 performs a first charge sharing between the capacitors C1 and capacitor C2. The switching capacitor units SCU1, according to a second bit of the least significant bits, selectively charges the capacitor C1 to the voltage VL or the voltage VH again and then the switching capacitor unit SCU2 performs a second charge sharing between the capacitors C1 and C2. The voltage VC2 is served as the output voltage VOUT.

Operations of the second conversion stage are described as follows with reference to FIGS. 4A~4D. In following example, it is assumed that the reference voltages VL and VH from the first conversion stage 20 are 22 mV and 23 mV respectively.

Figure 4A:
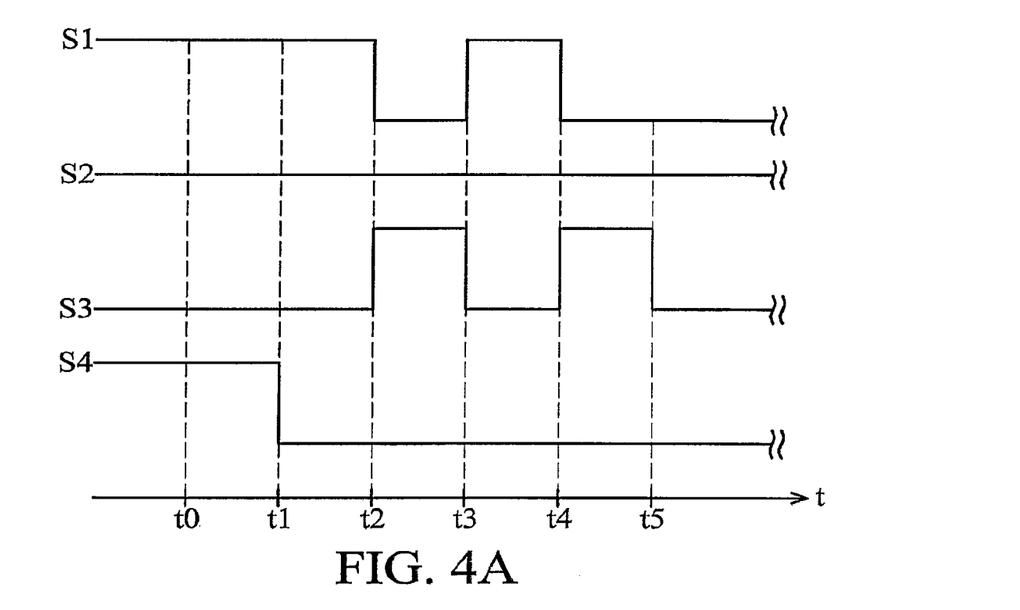
FIG. 4A~4D show control timing chart of the second conversion stage under different least significant bits.

The least significant bits=00:

During time t0-t1, the switches S1 and S4 are turned on to precharge the capacitors C1 and C2 to the reference voltage VL (22 mV). During time t1-t2, the switch S1 is turned on such that the capacitor C1 is coupled to the reference voltage VL (22 mV) because the first bit of the least significant bits is 0. Thus, the voltage VC1 at the node N1 is maintained at 22 mV. During time t2-t3, the switch S3 is turned on such that a first charge sharing is performed between the capacitors C1 and C2. Thus, the voltage VC2 at the node N2 is maintained at 22 mV because the voltages VC1 and VC2 are both 22 mV.

During time t3-t4, the switch S1 is turned on again such that the capacitor C1 is coupled to the reference voltage VL (22 mV) again because the second bit of the least significant bits is 0. Thus, the voltage VC1 at the node N1 is still maintained at 22 mV. During time t4-t5, the switch S3 is turned on again such that a second charge sharing is performed between the capacitors C1 and C2. Thus, the voltage VC2 at the node N2 is still maintained at 22 mV because the voltages VC1 and VC2 are both 22 mV.

Figure 4B:
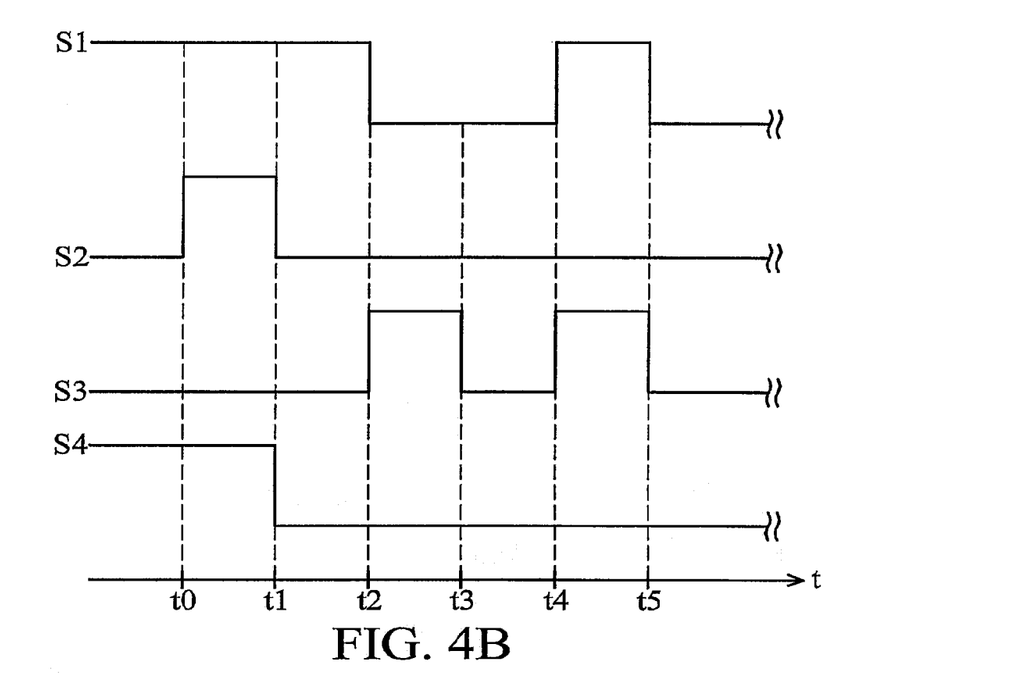

The least significant bits=01:

During time t0-t1, the switches S1 and S4 are turned on to precharge the capacitors C1 and C2 to the reference voltage VL (22 mV). During time t1-t2, the switch S2 is turned on such that the capacitor C1 is coupled to the reference voltage VH (23 mV) because the first bit of the least significant bits is 1. Thus, the voltage VC1 at the node N1 is charged to 23 mV. During time t2-t3, the switch S3 is turned on such that a first charge sharing is performed between the capacitors C1 and C2. Thus, the voltage VC2 at the node N2 is increased to 22.5 mV because the voltage VC1 is 23 mV and the voltage VC2 is 22 mV.

During time t3-t4, the switch S1 is turned on again such that the capacitor C1 is coupled to the reference voltage VL (22 mV) again because the second bit of the least significant bits is 0. Thus, the voltage VC1 at the node N1 is decreased to 22 mV. During time t4-t5, the switch S3 is turned on again such that a second charge sharing is performed between the capacitors C1 and C2. Thus, the voltage VC2 at the node N2 is still maintained at 22.25 mV because the voltages VC1 is 22 mV and the voltage VC2 is 22.5 mV.

Figure 4C:
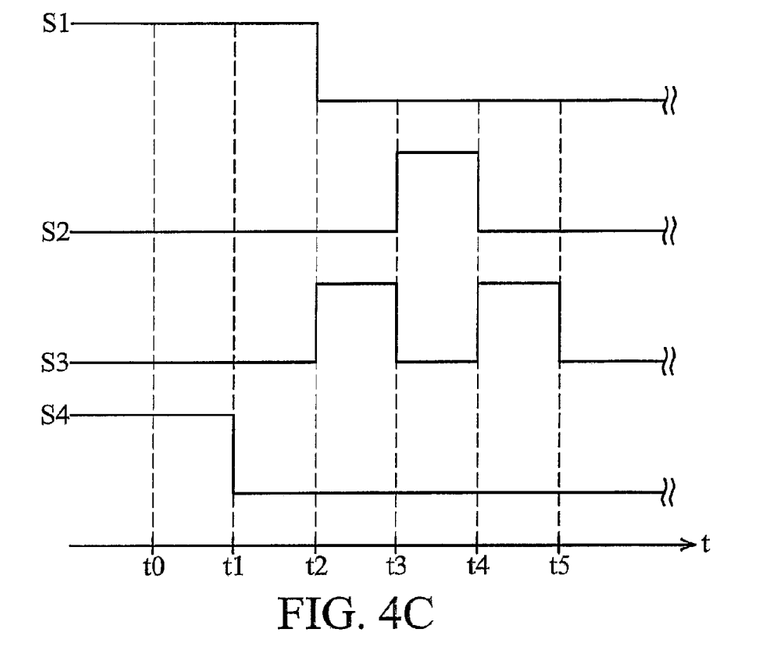

The least significant bits=10:

During time t0-t1, the switches S1 and S4 are turned on to precharge the capacitors C1 and C2 to the reference voltage VL (22 mV). During time t1-t2, the switch S1 is turned on such that the capacitor C1 is coupled to the reference voltage VL (22 mV) because the first bit of the least significant bits is 0. Thus, the voltage VC1 at the node N1 is maintained at 22 mV. During time t2-t3, the switch S3 is turned on such that a first charge sharing is performed between the capacitors C1 and C2. Thus, the voltage VC2 at the node N2 is maintained at 22 mV because the voltages VC1 and VC2 are both 22 mV.

During time t3-t4, the switch S2 is turned on such that the capacitor C1 is coupled to the reference voltage VH (23 mV) because the second bit of the least significant bits is 1. Thus, the voltage VC1 at the node N1 is increased to 23 mV. During time t4-t5, the switch S3 is turned on again such that a second charge sharing is performed between the capacitors C1 and C2. Thus, the voltage VC2 at the node N2 is increased to 22.5 mV because the voltages VC1 is 23 mV and the voltage VC2 is 22 mV.

Figure 4D:
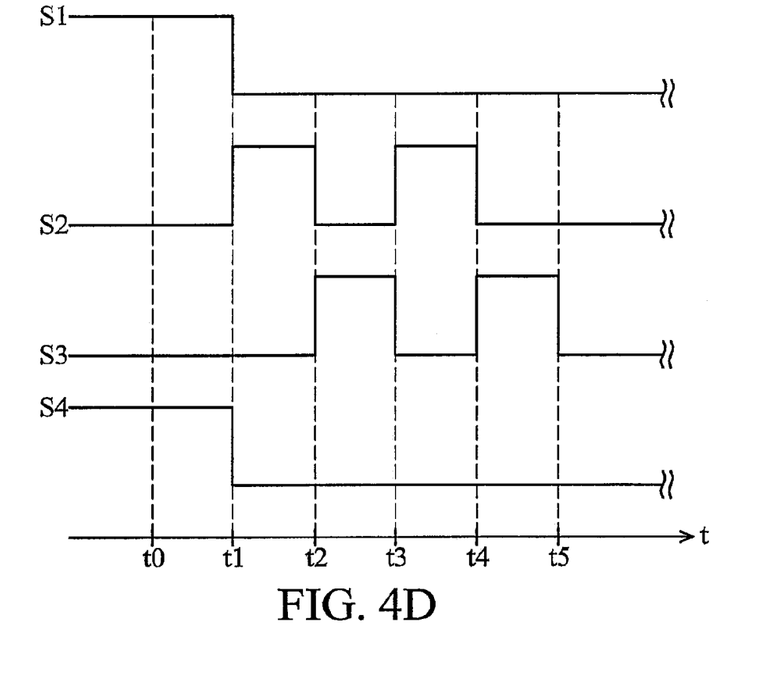

The least significant bits=11:

During time t0-t1, the switches S1 and S4 are turned on to precharge the capacitors C1 and C2 to the reference voltage VL (22 mV). During time t1-t2, the switch S2 is turned on such that the capacitor C1 is coupled to the reference voltage VH (23 mV) because the first bit of the least significant bits is 1. Thus, the voltage VC1 at the node N1 is charged to 23 mV. During time t2-t3, the switch S3 is turned on such that a first charge sharing is performed between the capacitors C1 and C2. Thus, the voltage VC2 at the node N2 is increased to 22.5 mV because the voltage VC1 is 23 mV and the voltage VC2 is 22 mV.

During time t3-t4, the switch S2 is turned on again such that the capacitor C1 is coupled to the reference voltage VH (23 mV) again because the second bit of the least significant bits is 1. Thus, the voltage VC1 at the node N1 is still maintained at 23 mV. During time t4-t5, the switch S3 is turned on again such that a second charge sharing is performed between the capacitors C1 and C2. Thus, the voltage VC2 at the node N2 is increased to 22.75 mV because the voltage VC1 is 23 mV and the voltage VC2 is 22.5 mV.

In view of this, the second conversion stage 30 outputs 22 mV, 22.25 mV, 22.5 mV and 22.75 mV respectively, when the least significant bits are 00, 01, 10 and 11. Namely, the second conversion stage 30 can generate 2n kinds of voltages VC2, serving as the output voltage VOUT output to the load $C_{LOAD}$, according to n least significant bits.

Figure 5:
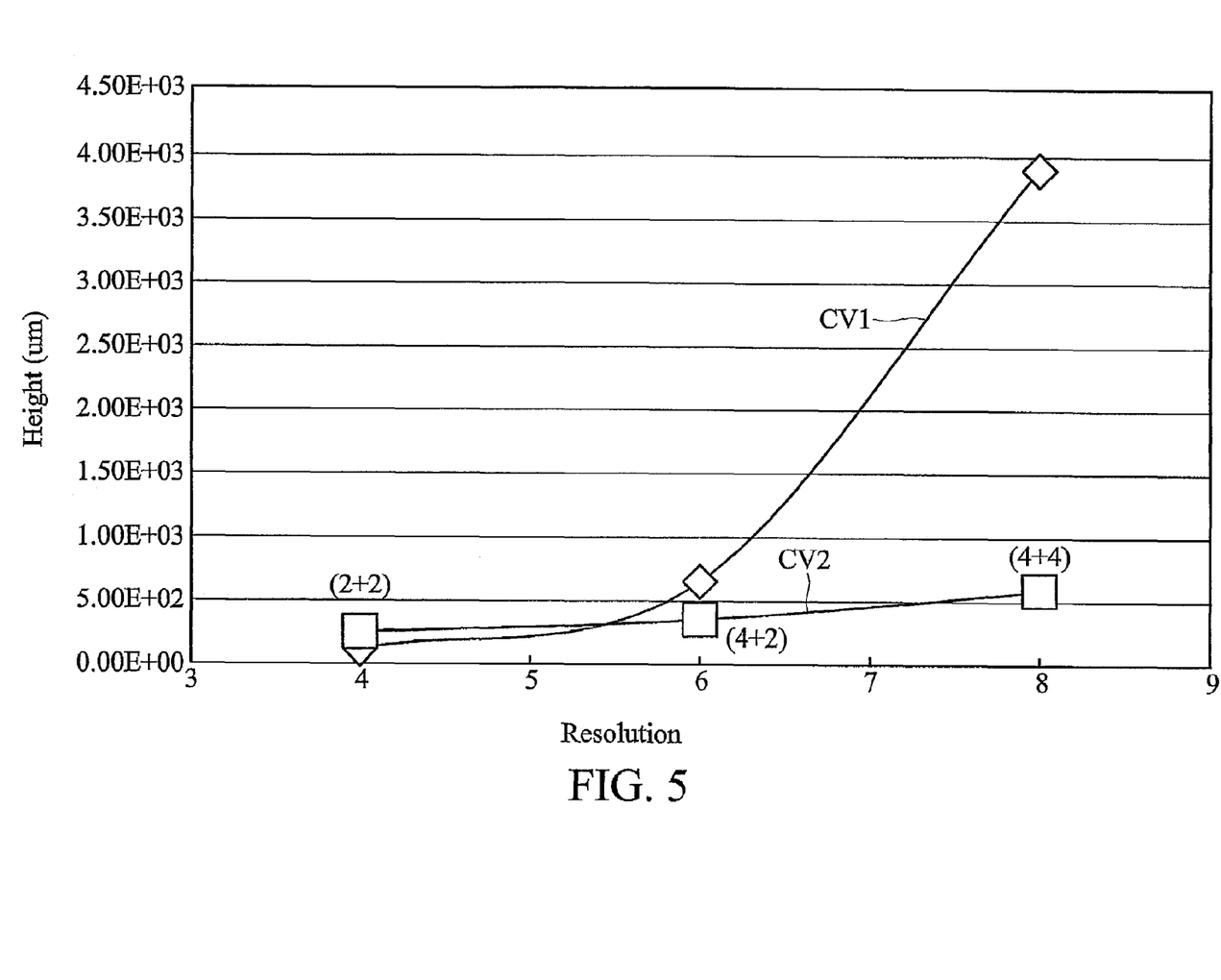
FIG. 5 shows the relationship between resolution and height of digital-to-analog converters.

FIG. 5 shows the relationship between resolution and height of digital-to-analog converters. As shown, the curve CV1 shows the relationship between resolution and height of conventional R-digital-to-analog converter and the curve CV2 shows the relationship between resolution and height of two stages digital-to-analog converter of the invention.

In this embodiment, resolution means bit number of the k bit input signal comprising m most significant bits and n least significant bits. For example, n and m are both 2 when k is 4, m is 4 and n is 2 when k is 6, and m is 6 and n is 2 when k is 8, or m and n are both 4 when k is 8. When bit number of the k bit input signal is 8 (k=8), the height of the conventional R-matrix DAC is almost 8 times that of the two stages DAC in the invention. Thus, the digital-to-analog converter can save more layout area as the bit number of the k bit input signal is increased.

Figure 6:
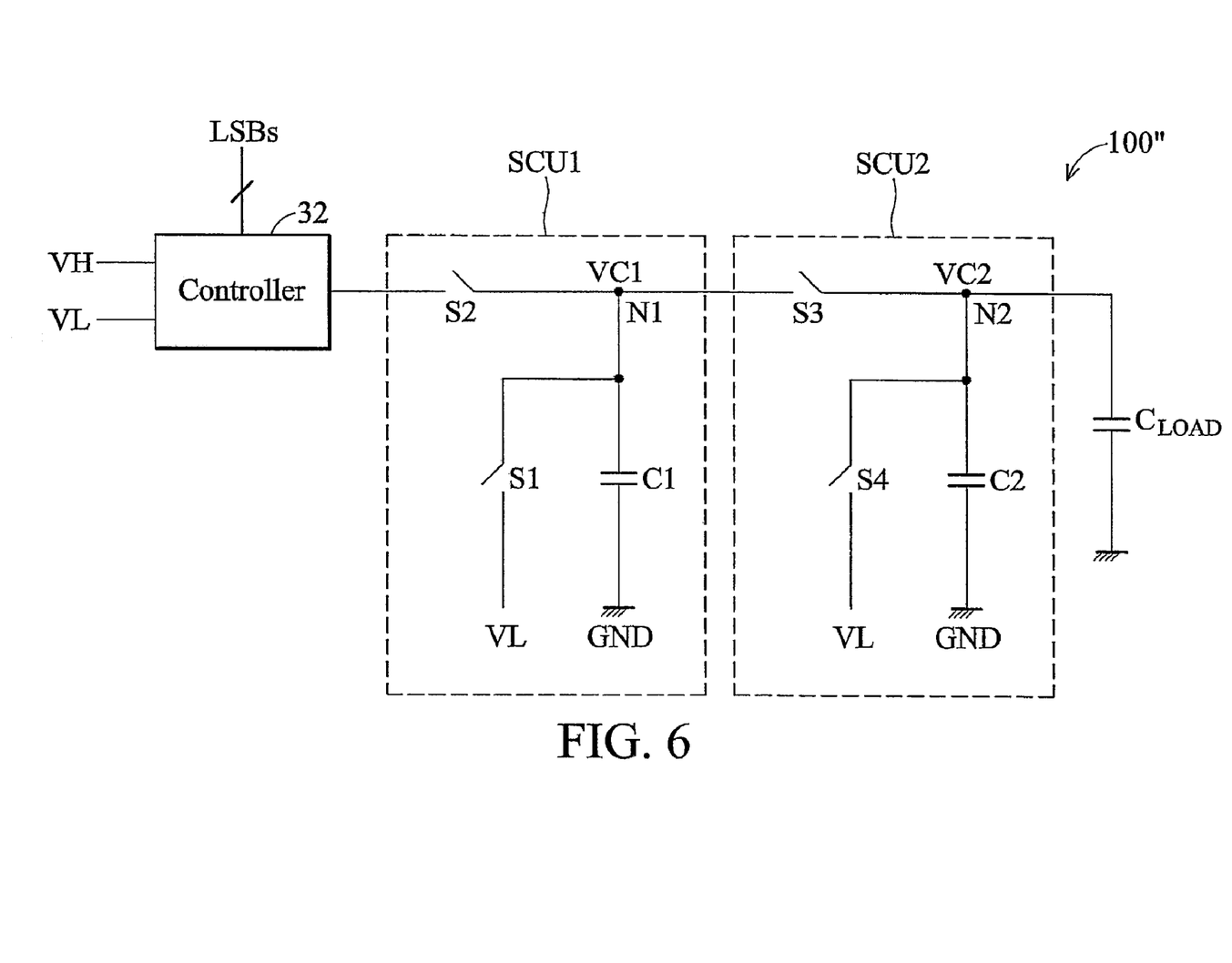
FIG. 6 shows another embodiment of a second conversion stage.

FIG. 6 shows another embodiment of a second conversion stage. As shown, the second conversion stage 30" is similar to the conversion stage 30 shown in FIG. 3 exception that a controller 32. The controller 32 is coupled between the reference voltages VL and VH from the first conversion stage 20 and the switching capacitor unit SCU1, and selectively outputs the reference voltages VL and VH to the switching capacitor unit SCU1 according to the n least significant bits (LSBs).

Operations of the second conversion stage 30" are described as follows with reference to FIG. 4D. For example, the switches S1 and S4 are turned on during time t0~t1, the switch S2 is turned on during time t1~t2, the switch S3 is turned on during time t2~t3, the switch S2 is turned on again during time t3~t4, the switch S3 is turned on again during time t4~t5. In following example, it is assumed that the reference voltages VL and VH from the first conversion stage 20 are 22 mV and 23 mV respectively.

The least significant bits=00:

During time t0-t1, the switches S1 and S4 are turned on to precharge the capacitors C1 and C2 to the reference voltage VL (22 mV). During time t1-t2, the switch S1 is turned on, and the controller 32 outputs the reference voltage VL because the first bit of the least significant bits is 0, such that the capacitor C1 is coupled to the reference voltage VL (22 mV). Thus, the voltage VC1 at the node N1 is charged to 22 mV. During time t2-t3, the switch S3 is turned on such that a first charge sharing is performed between the capacitors C1 and C2. Thus, the voltage VC2 at the node N2 is maintained at 22 mV because the voltages VC1 and VC2 are both 22 mV.

During time t3-t4, the switch S2 is turned on again, and the controller outputs the reference voltage VL because the second bit of the least significant bits is 1, such that the capacitor C1 is charged by the reference voltage VL (22 mV) again. Thus, the voltage VC1 at the node N1 is still maintained at 22 mV. During time t4-t5, the switch S3 is turned on again such that a second charge sharing is performed between the capacitors C1 and C2. Thus, the voltage VC2 at the node N2 is still maintained at 22 mV because the voltages VC1 and VC2 are both 22 mV.

The least significant bits=01:

During time t0-t1, the switches S1 and S4 are turned on to precharge the capacitors C1 and C2 to the reference voltage VL (22 mV). During time t1-t2, the switch S1 is turned on, and the controller 32 outputs the reference voltage VH because the first bit of the least significant bits is 1, such that the capacitor C1 is coupled to the reference voltage VH (23 mV). Thus, the voltage VC1 at the node N1 is charged to 23 mV. During time t2-t3, the switch S3 is turned on such that a first charge sharing is performed between the capacitors C1 and C2. Thus, the voltage VC2 at the node N2 is increased to 22.5 mV because the voltage VC1 is 23 mV and the voltage VC2 is 22 mV.

During time t3-t4, the switch S2 is turned on again, and the controller outputs the reference voltage VL because the second bit of the least significant bits is 1, such that the capacitor C1 is coupled to the reference voltage VL (22 mV). Thus, the voltage VC1 at the node N1 is decreased to 22 mV. During time t4-t5, the switch S3 is turned on again such that a second charge sharing is performed between the capacitors C1 and C2. Thus, the voltage VC2 at the node N2 is decreased to 22.25 mV because the voltage VC1 is 22 mV and the voltage VC2 is 22.5 mV.

The least significant bits=10:

During time t0-t1, the switches S1 and S4 are turned on to precharge the capacitors C1 and C2 to the reference voltage VL (22 mV). During time t1-t2, the switch S1 is turned on, and the controller 32 outputs the reference voltage VL because the first bit of the least significant bits is 0, such that the capacitor C1 is coupled to the reference voltage VL (22 mV). Thus, the voltage VC1 at the node N1 is charged to 22 mV. During time t2-t3, the switch S3 is turned on such that a first charge sharing is performed between the capacitors C1 and C2. Thus, the voltage VC2 at the node N2 is maintained at 22 mV because the voltages VC1 and VC2 are both 22 mV.

During time t3-t4, the switch S2 is turned on again, and the controller outputs the reference voltage VH because the second bit of the least significant bits is 1, such that the capacitor C1 is coupled to the reference voltage VH (23 mV). Thus, the voltage VC1 at the node N1 is increased to 23 mV. During time t4-t5, the switch S3 is turned on again such that a second charge sharing is performed between the capacitors C1 and C2. Thus, the voltage VC2 at the node N2 is increased to 22.5 mV because the voltage VC1 is 23 mV and the voltage VC2 is 22 mV.

The least significant bits=11:

During time t0-t1, the switches S1 and S4 are turned on to precharge the capacitors C1 and C2 to the reference voltage VL (22 mV). During time t1-t2, the switch S1 is turned on, and the controller 32 outputs the reference voltage VH because the first bit of the least significant bits is 1, such that the capacitor C1 is coupled to the reference voltage VH (23 mV). Thus, the voltage VC1 at the node N1 is charged to 23 mV. During time t2-t3, the switch S3 is turned on such that a first charge sharing is performed between the capacitors C1 and C2. Thus, the voltage VC2 at the node N2 is increased to 22.5 mV because the voltage VC1 is 23 mV and the voltage VC2 is 22 mV.

During time t3-t4, the switch S2 is turned on again, and the controller outputs the reference voltage VH because the second bit of the least significant bits is 1, such that the capacitor C1 is coupled to the reference voltage VH (23 mV). Thus, the voltage VC1 at the node N1 is maintained at 23 mV. During time t4-t5, the switch S3 is turned on again such that a second charge sharing is performed between the capacitors C1 and C2. Thus, the voltage VC2 at the node N2 is increased to 22.75 mV because the voltage VC1 is 23 mV and the voltage VC2 is 22.5 mV.

Figure 7:
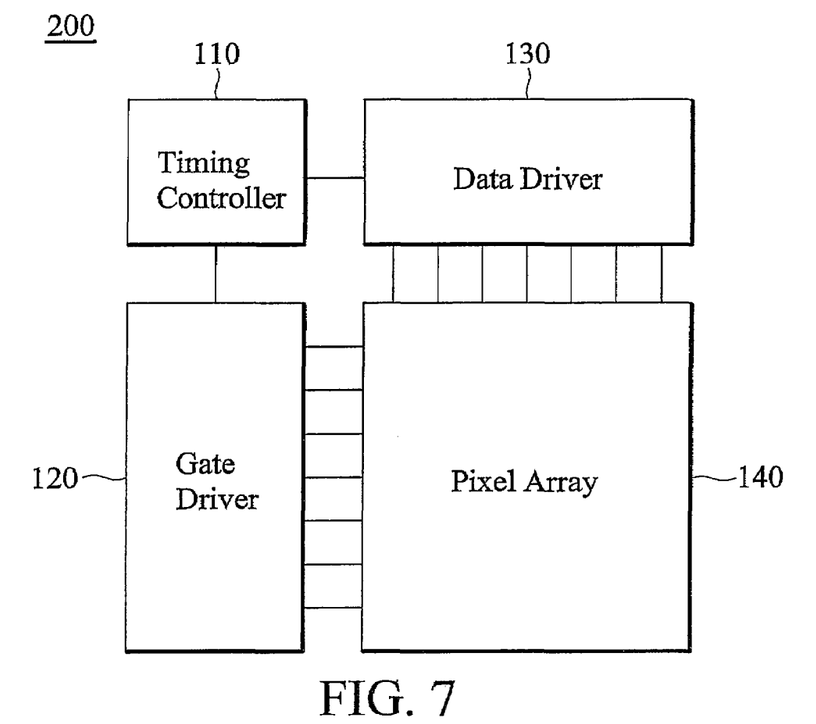
FIG. 7 shows an embodiment of a system for displaying images.

FIG. 7 shows an embodiment of a system for displaying images that implemented as a display panel. As shown in FIG. 1, display panel 200 comprises a gate driver 120, a data driver 130, a pixel array 140 and a timing controller 420, in which data driver 130 comprises a plurality of digital-to-analog converters such as the described signal driving circuit 100. In the display panel 200, the pixel array 140 is operatively coupled to the scan driver 120 and the data driver 130. The gate driver 120 outputs a plurality of driving pulses in turn to scan display array 140, and the data driver 130 provides data signals to drive the display array 140. The timing controller 120 provides clock signals and data signals to the gate driver 120 and the data driver 130. For example, the switches S1~S4 and the controller 32 shown in FIG. 3 and FIG. 6 are controlled by the timing controller 110.

Figure 8:
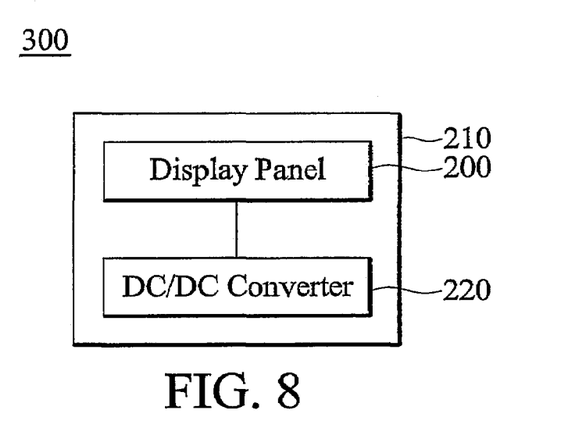
FIG. 8 shows another embodiment of a system for displaying images.

FIG. 8 schematically shows another embodiment of a system for displaying images, implemented here as an electronic device 300, comprising a display panel, such as display panel 200, which can be a plasma display panel, an organic light emitting display panel, or a cathode ray tube display panel in other embodiments, but is not limited thereto. The electronic device 300 may be a digital camera, a portable DVD, a television, a car display, a PDA, notebook computer, tablet computer, cellular phone, or a display device, etc. Generally, the electronic device 300 includes a housing 210, the display panel 200 and a DC/DC converter 220. The DC/DC converter 220 is operatively coupled to the display panel 200 and provides an output voltage powering the display panel 200 to display images.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A digital-to-analog converter comprising:
a first conversion stage selecting first and second voltages of a plurality of reference voltages according to m most significant bits of a k bit input signal; and
a second conversion stage precharging an output load to the first voltage selected by the first conversion stage and converting n least significant bits of the k bit input signal to a voltage between the first and second voltages, wherein the second conversion stage comprises:
first and second switching capacitor units connected in series, the first switching capacitor unit, according to a first bit of the n least significant bits, selectively charges a first capacitor to the first voltage or the second voltage and then the second switching capacitor unit performs a first charge sharing between the first capacitor and a second capacitor, and the first switching capacitor unit, according to a second bit of the n least significant bits, selectively charges the first capacitor to the first voltage or the second voltage again and then the second switching capacitor unit performs a second charge sharing between the first capacitor and the second capacitor.

2. The digital-to-analog as claimed in claim 1, wherein the first voltage and the second voltage have consecutive value.

3. The digital-to-analog converter as claimed in claim 2, wherein the first voltage is smaller than the second voltage.

4. The digital-to-analog converter as claimed in claim 3, wherein m+n=k.

5. The digital-to-analog converter as claimed in claim 4, wherein the first conversion stage 20 is a R-matrix digital-to-analog converter.

6. The digital-to-analog converter as claimed in claim 5, wherein the digital-to-analog converter further comprises a reference voltage unit 10 with a plurality of resistors connected in series and coupled between the first power voltage and a second power voltage, generating the plurality of reference voltages.

7. A system for displaying images, comprising:
a data driver comprising a plurality of digital-to-analog converters, wherein each digital-to-analog converter comprises:
a first conversion state selecting first and second voltages of a plurality of reference voltages according to m most significant bits of a k bit input signal; and
a second conversion state precharging an output load to the first voltage selected by the first conversion stage and converting n least significant bits of the k bit input signal to a voltage between the first and second voltages, wherein the second conversion stage comprises:
first and second switching capacitor units connected in series, the first switching capacitor unit, according to a first bit of the n least significant bits, selectively charges a first capacitor to the first voltage or the second voltage and then the second switching capacitor unit performs a first charge sharing between the first capacitor and a second capacitor, and the first switching capacitor unit, according to a second bit of the n least significant bits, selectively charges the first capacitor to the first voltage or the second voltage again and then the second switching capacitor unit performs a second charge sharing between the first capacitor and the second capacitor; and a timing controller controlling the first and second switching capacitor units in the digital-to-analog converter.

8. The system as claimed in claim 7, wherein the system comprises a display panel, wherein the digital-to-analog converter and the timing controller form a portion of the display panel.

9. The system as claimed in claim 8, wherein the display panel is a liquid crystal display panel, an original light emitting display panel, or a plasma display panel.

10. The system as claimed in claim 8, further comprising an electronic device, wherein the electronic device comprises:
the display panel; and
a DC/DC converter coupled to the display panel and operative to power the display panel.

11. The system as claimed in claim 10, wherein the electronic device is a digital camera, a portable DVD, a television, a car display, a PDA, a display monitor, a notebook computer, a tablet computer, or a cellular phone.

12. A digital-to-analog converter comprising:
a first conversion stage selecting first and second voltages of a plurality of reference voltages according to m most significant bits of a k bit input signal, wherein the first voltage is smaller that the second voltage; and
a second conversion stage converting n least significant bits of the k bit input signal to a voltage between the first and second voltages, wherein the second conversion stage comprises:
first and second capacitors coupled between a first node and a first power voltage and a second node and the first power voltage respectively;
first switch coupled between the first voltage and the first node;
second switch coupled between the second voltage and the first node;
third switch coupled between the first node and the second node, and
fourth switch coupled between the first voltage and the second node;
wherein the first and the fourth switches are turned on to precharge the first and second capacitors to the first voltage during a first period, and the first switch and the second switch are selectively turned on according to a first bit of the n least significant bits during a second period, charging the first capacitor and then the third switch is turned on such that a first charge sharing is performed between the first and the second capacitor, and the first switch and the second switch are selectively turned on according to a second bit of the n least significant bits during a third period, charging the first capacitor again and then the third switch is turned on such that a second charge sharing is performed between the first and the second capacitors.

13. The digital-to-analog converter as claimed in claim 12, wherein the first capacitor is coupled to the first voltage by the first switch when the first bit or the second bit is 0, and the first capacitor is coupled to the second voltage by the second switch when the first bit is 1.

14. The digital-to-analog converter as claimed in claim 13, wherein m+n=k.

15. A system for displaying images, comprising:
a data driver; and
a timing controller;
wherein the data driver comprises at least one digital-to-analog converter, wherein the digital-to-analog converter comprises:
a first conversion stage selecting first and second voltages of a plurality of reference voltages according to m most significant bits of a k bit input signal, wherein the first voltage is smaller that the second voltage; and
a second conversion stage converting n least significant bits of the k bit input signal to a voltage between the first and second voltages, wherein the second conversion state comprises:
first and second capacitors coupled between a first node and a first power voltage and a second node and the first power voltage respectively;
first switch coupled between the first voltage and the first node;
second switch coupled between the second voltage and the first node;
third switch coupled between the first node and the second node, and
fourth switch coupled between the first voltage and the second node;
wherein the first and the fourth switches are turned on to precharge the first and second capacitors to the first voltage during a first period, and the first switch and the second switch are selectively turned on according to a first bit of the n least significant bits during a second period, charging the first capacitor and then the third switch is turned on such that a first charge sharing is performed between the first and the second capacitor, and the first switch and the second switch are selectively turned on according to a second bit of the n least significant bits during a third period, charging the first capacitor again and then the third switch is turned on such that a second charge sharing is performed between the first and the second capacitors; and
wherein the timing controller is configured to control the first, the second, the third and the fourth switches in the digital-to-analog converter.

16. The system as claimed in claim 15, further comprising a display panel, wherein the digital-to-analog converter and the timing controller form a portion of the display panel.

17. The system as claimed in claim 16, wherein the display panel is a liquid crystal display panel, an original light emitting display panel, or a plasma display panel.

18. A digital-to-analog converter comprising:
a first conversion stage selecting first and second voltages of a plurality of reference voltages according to m most significant bits of a k bit input signal; and
a second conversion stage converting n least significant bits of the k bit input signal to a voltage between the first and second voltages, wherein the second conversion stage comprises:
a first switching capacitor unit comprising first and second switches and a first capacitor;
a second switching capacitor unit connected to the first switching capacitor unit in series and comprising third and fourth switches and a second capacitor, wherein during a first period, the first and second switching capacitor units precharge an output load to the first voltage; and
a controller selectively outputting the first and second voltages to the first switching capacitor unit according to the n least significant bits, wherein during a second period, the controller selectively outputs the first voltage or the second voltage according to a first bit of the n least significant bits such that the first switching capacitor unit charges the first capacitor accordingly and the second switching capacitor unit performs a first charge sharing between the first capacitor and the second capacitor, and during a second period, the controller selectively outputs the first voltage or the second voltage again according to a second bit of the n least significant bits such that the first switching capacitor unit charges a first capacitor accordingly and the second switching capacitor unit performs a second charge sharing between the first capacitor and the second capacitor.

19. The digital-to-analog converter as claimed in claim 18, wherein the first capacitor is charged to the first voltage by the first switch when the first bit or the second bit is 0, and the first capacitor is charged to the second voltage by the second switch when the first bit is 1, in which the first voltage is smaller than the second voltage.

\* \* \* \* \*